United States Patent [19]
Patterson

[11] Patent Number: 5,883,536
[45] Date of Patent: Mar. 16, 1999

[54] DIGITAL PHASE DETECTOR DEVICE ULTILIZING DITHER GENERATOR

[75] Inventor: Jeffery S. Patterson, Santa Rosa, Calif.

[73] Assignee: Hewlett-Packard Company, Palo Alto, Calif.

[21] Appl. No.: 873,494

[22] Filed: Jun. 12, 1997

[51] Int. Cl.[6] .................................................. G01R 25/08
[52] U.S. Cl. .............................. 327/184; 327/7; 327/12; 327/3; 327/150; 327/151
[58] Field of Search ................................ 327/184, 7, 150, 327/151, 12, 3

[56] References Cited

U.S. PATENT DOCUMENTS

| | | |
|---|---|---|
| 4,374,438 | 2/1983 | Crowley .................................. 331/1 A |
| 4,519,091 | 5/1985 | Chu et al. ................................. 377/44 |
| 4,654,586 | 3/1987 | Evans ........................................... 327/7 |
| 5,019,786 | 5/1991 | Fairley ......................................... 327/3 |
| 5,049,766 | 9/1991 | Van Driest ................................. 327/19 |
| 5,488,641 | 1/1996 | Ozkan ..................................... 327/150 |

*Primary Examiner*—Timothy P. Callahan
*Assistant Examiner*—April Giles
*Attorney, Agent, or Firm*—John L. Imperato

[57] ABSTRACT

A phase detector provides a digital output having a linear relationship to the phase difference between a reference signal and an applied input signal. The phase detector counts the number of cycles of the reference signal within a time interval determined by the difference in arrival times of corresponding amplitude transitions of the reference signal and the input signal. A digital output representing the number of counted cycles is produced. A dither generator adds random time variation to the time interval over which the reference signal cycles are counted to introduce a corresponding random variation in the digital output.

10 Claims, 4 Drawing Sheets

DIGITAL PHASE DETECTOR DEVICE ULTILIZING DITHER GENERATOR

FIELD OF THE INVENTION

The present invention relates to phase detectors and more particularly to a digital phase detector that receives analog signals and produces a digital output having a linear relationship to the phase difference between the analog signals.

BACKGROUND OF THE INVENTION

Digital signal processing (DSP) is used in a variety of digital systems to achieve high performance at low manufacturing costs. The benefits of DSP can be extended to systems incorporating phase detectors, such as receivers and measurement systems, that receive and phase compare analog signals, but effective use of DSP in these systems depends on first obtaining a digital representation of the compared phase. However, finite quantization steps in any digital representation of the analog phase difference introduce nonlinearities similar to those inherent in analog-to-digital converters (ADCs) used to digitize the amplitudes of analog signals. Amplitude dithering, a known linearization technique for ADCs, is based on adding noise to the amplitude of the applied analog signal. Sufficient random amplitude variation is introduced by the added noise to overcome nonlinearities caused by the quantization steps. However, amplitude dithering is ineffective at linearizing phase detectors which respond to the relative phases of applied analog signals. Accordingly, there is a need for a phase detector that produces a digital output having a linear relationship to the phase difference between the applied analog signals.

SUMMARY OF THE INVENTION

According to a preferred embodiment of the present invention, a phase detector generates a digital output that has a linear relationship to the phase difference between two applied analog signals. The first analog signal, or reference, is frequency divided and applied to a first input of a pulse generator, while the second analog signal is also frequency divided and applied to a second input of the pulse generator. Based on the time delay between corresponding amplitude transitions of the first and second analog signals at its inputs, the pulse generator produces a gating pulse. A counter counts the number of cycles of the reference within the time duration of the gating pulse to generate a digital representation of the phase difference between the two analog signals. Although the finite resolution of the counter introduces nonlinearities, a dither source coupled to the first input of the pulse generator linearizes the conversion of the analog phase difference to the digital output by adding random time uncertainty, or jitter, to the frequency-divided reference. This jitter introduces random variations in the time duration of the gating pulse, providing corresponding variations in the counted number of reference cycles. The variations are sufficient to overcome the nonlinearity caused by the finite resolution of the counter. According to an alternative preferred embodiment of the present invention, the dither generator is coupled to a latch input of the counter to introduce random uncertainty in the counted number of reference cycles.

DETAILED DESCRIPTION OF THE PREFERRED EMBODIMENT

Figure 1:
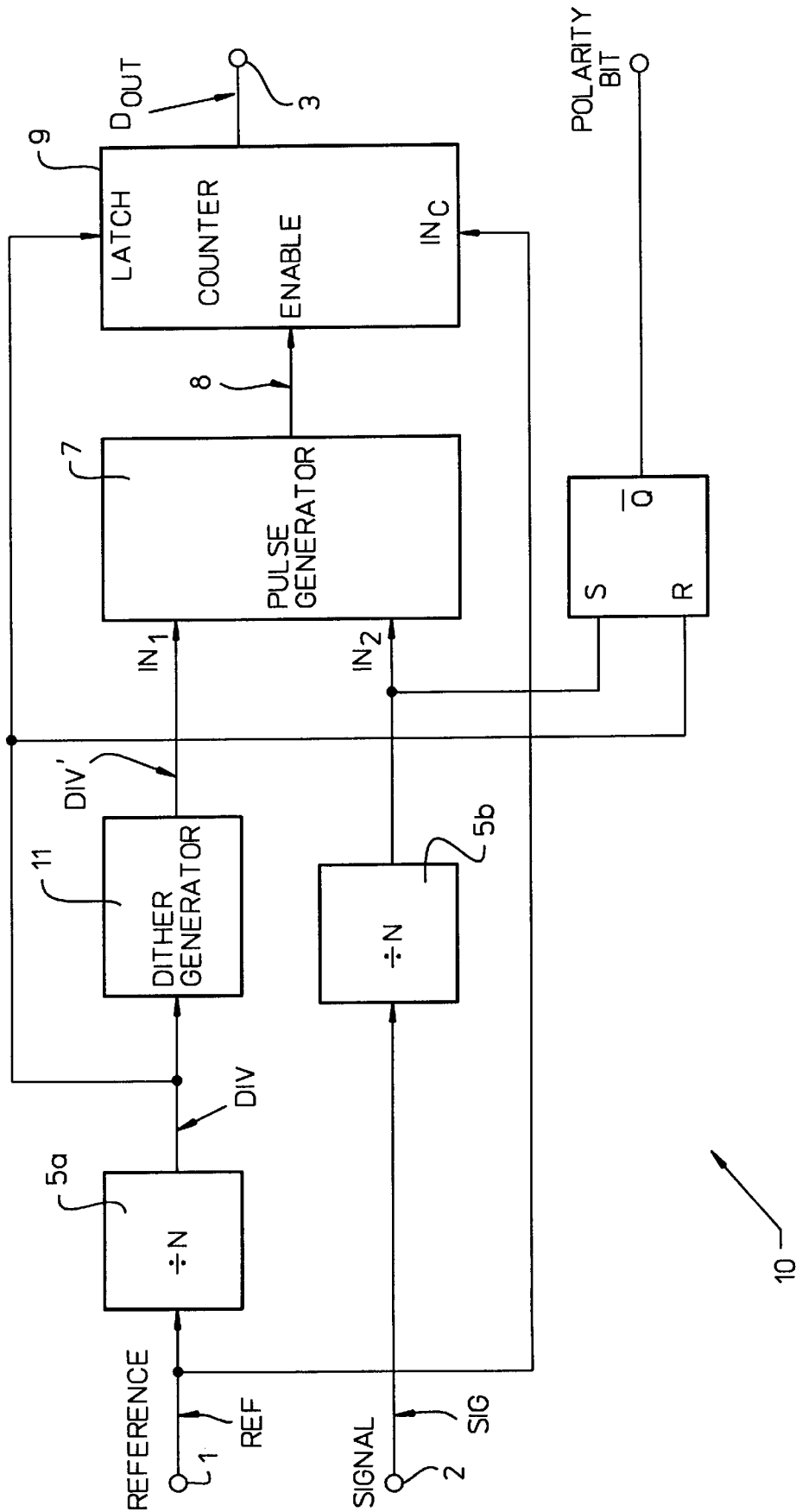
FIG. 1 shows a digital phase detector constructed according to a first preferred embodiment of the present invention.
Figure 2:
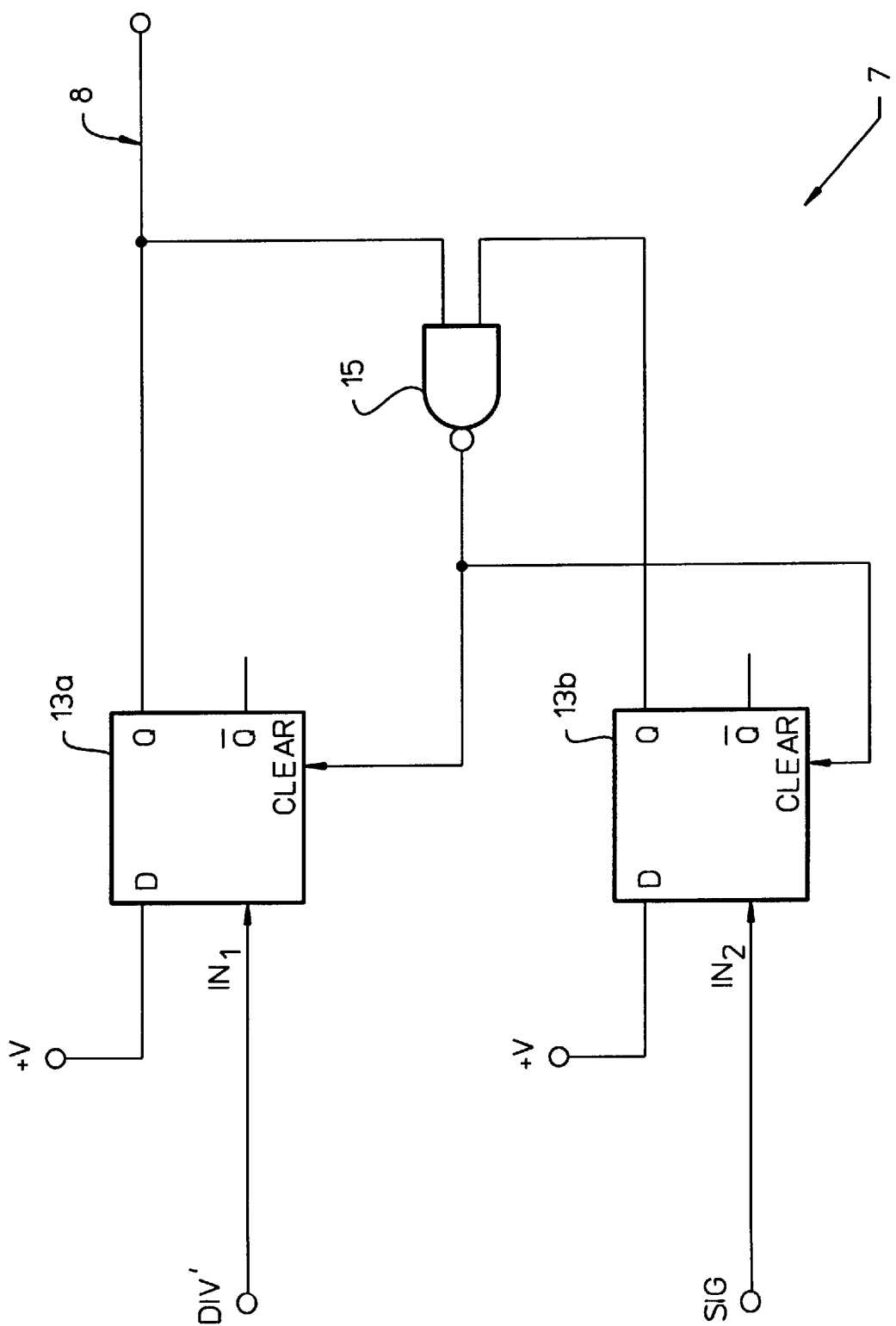
FIG. 2 shows a pulse generator incorporated into the digital phase detector of FIG. 1.

FIG. 1 shows a digital phase detector 10 constructed according to a first preferred embodiment of the present invention. The phase detector 10 receives an analog reference signal REF at a first input 1 and an analog input signal SIG at the second input 2. At an output 3, the digital phase detector 10 produces a digital output $D_{OUT}$, representing the phase difference between the reference signal REF and the input signal SIG. The frequency $F_{REF}$ of the reference signal REF is divided by an integer N by a first frequency divider 5a. The frequency of the input signal SIG, also equal to $F_{REF}$, is divided by an integer N by a second frequency divider 5b and is applied directly to input IN2 of the pulse generator 7. A divided signal DIV at the output of the divider 5a is applied to a dither generator 11 producing an output signal DIV' that is applied to an input IN1 of a pulse generator 7. The pulse generator 7 produces an gating pulse 8 having a width td which is determined by the time difference td between corresponding amplitude transitions (for example, the rising edges or falling edges) of the reference signal REF, and the input signal SIG present at inputs IN1 and IN2 of the pulse generator 7. FIG. 2 shows one example of the pulse generator 7, implemented using D flip-flops 13a and 13b, and a NAND gate 15.

The pulse generator 7 may also be implemented using exclusive OR gates or other known circuitry. The gating pulse 8 provided by the pulse generator 7 is applied to the enable input of a counter 9 shown in FIG. 1, and the reference signal REF is applied to the input INc of the counter 9. The gating pulse 8 defines a time interval td over which cycles of the reference signal REF are counted. After the contents of the counter 9 are latched by the divided signal DIV, the counter 9 resets. In U.S. Pat. No. 4,519,091, herein incorporated by reference, Chu et al. describe a method of latching the instantaneous contents of a high-speed counter 9 without interrupting the counting process.

During the time duration td of each gating pulse 8, the counter 9 counts $F_{REF}$*td cycles of the reference signal REF. The time duration td, between corresponding amplitude transitions of the reference signal REF and the input signal SIG, is preserved through the division performed by the dividers 5a and 5b. The counted number of reference signal cycles is latched at a rate equal to the frequency of the divided signal DIV and represents the phase difference between the reference signal REF and the input signal SIG at input 1 and input 2, respectively, truncated to an integer number of cycles. The integer divisor N of the dividers 5a, 5b is chosen according to the maximum rate at which the counter 9 can be latched. N sets the maximum phase difference, measurable in the integer number of cycles between the reference signal REF and the input signal SIG. The operating range of the digital phase detector 10 can be extended to plus and minus N cycles by a polarity bit added by an optional polarity bit generator 13. In this example, the polarity bit generator 13 is implemented using an SR latch or flip-flop to record which corresponding amplitude transition, that of the reference signal REF or that of the input signal SIG, is first to arrive at the pulse generator 7. The SR latch is set by the divided input signal present at input IN2 of the pulse generator 7 and is reset by the divided reference signal DIV, present at input IN1 of the pulse generator 7.

The digital output $D_{OUT}$ represents the analog phase difference between the input signals SIG and the reference signal REF. This digitization of the analog phase difference, performed by the dividers 5a, 5b, the pulse generator 7 and the counter 9 is an analog-to-digital conversion and is therefore subject to the non-linearity inherent in any analog-to-digital conversion process due to quantization effects. In the first preferred embodiment of the present invention shown in FIG. 1, a dither generator 11 is positioned between the frequency divider 5 and the first input IN1 of the pulse generator 7. The dither generator 11 adds a random time variation to an edge of the enable pulse 8 thereby introducing a random variation in the time duration or width td of the gating pulse 8. This variation in the gating pulse 8 causes a corresponding random variation in the digital output of the counter 9 at the output 3. The dither generator 11 provides enough random variation in the digital output $D_{OUT}$ to induce variations in the counted value equivalent to one or more cycles of the reference signal REF. This variation in the digital output linearizes the conversion of the analog phase difference to the digital output $D_{OUT}$. The variance in the digital output $D_{OUT}$ introduced by the dither generator 11 may be reduced through subsequent averaging or filtering (not shown).

Figure 3:
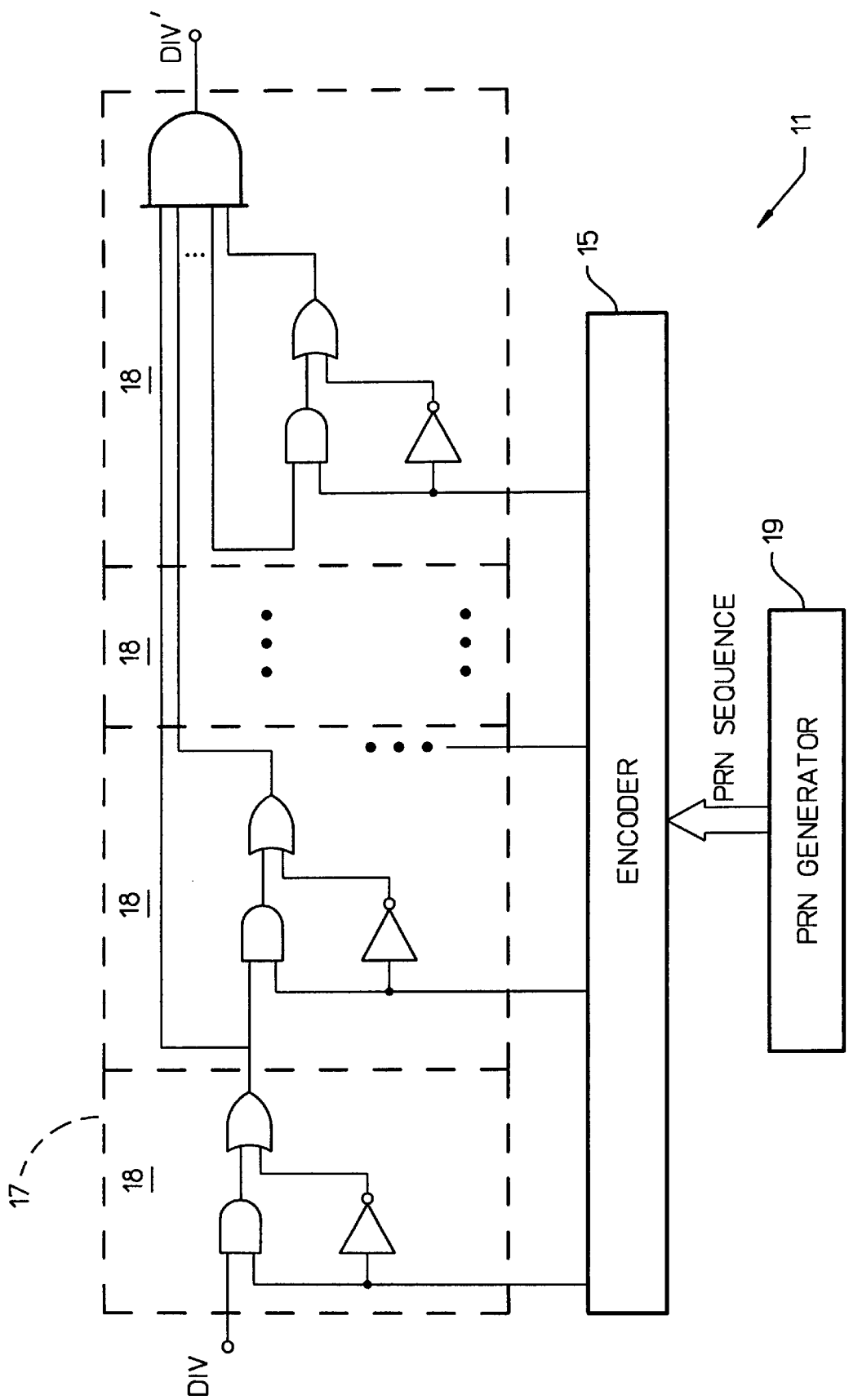
FIG. 3 shows a dither generator incorporated into the digital phase detector.

FIG. 3 shows a detailed view of the dither generator 11 included in the digital phase detector 10. The dither generator 11 receives the reference signal REF and provides a dithered reference signal DIV' to the first input IN1 of the gate generator 7. A pseudo-random number (PRN) generator 19 generates a PRN sequence that is applied to an encoder 15. The encoder 15 maps an integer input from the PRN generator 19 to a logic value that has the number of bits set high equivalent to the integer input. The logic values from the encoder 15 are applied to the logic delay block 17 which introduces propagation delay through the logic delay block 17 according to the PRN sequence. As the reference signal REF propagates through the dither block 11, the logic delay block 17 adds random variations in the timing of the applied reference signal REF. For example, if the delay added by each segment 18 of the logic delay block 17 is 3 nanoseconds and the number of segments 18 is ten, a maximum time variation of 30 nanoseconds is applied to the reference signal REF. A mean propagation delay through the logic delay block 17 of 15 nanoseconds results.

Figure 4:
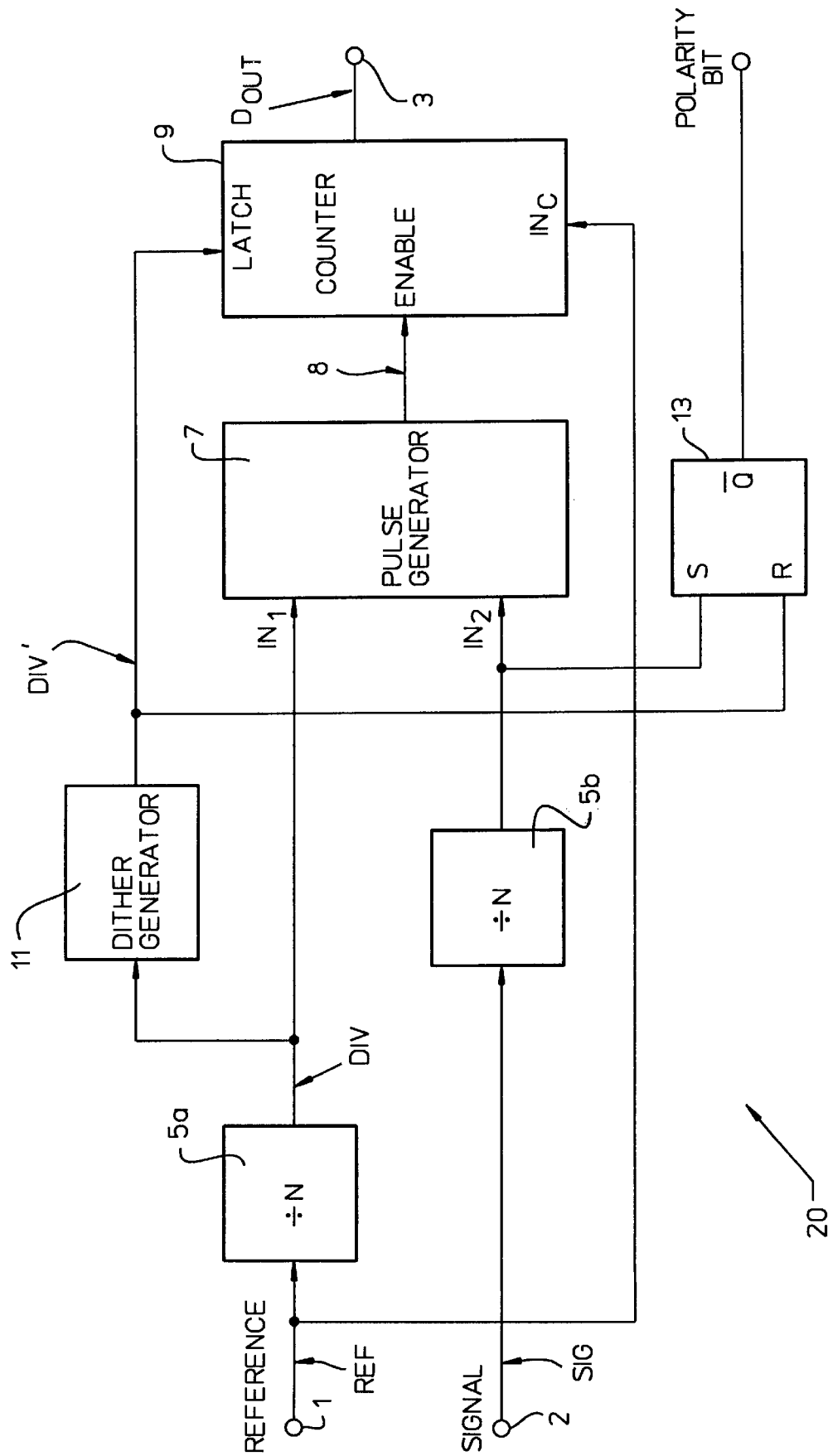
FIG. 4 shows a digital phase detector constructed according to a second preferred embodiment of the present invention.

FIG. 4 shows a digital phase detector 20 constructed according to a second preferred embodiment of the present invention. In this embodiment, the dither generator 11 receives the reference signal REF and the dithered reference signal DIV' provides the latch input to the counter 9. The addition of random time variations to the latch input of counter, causes a corresponding random variation in the digital output $D_{OUT}$ of the counter 9 at the output 3. The random variations in the digital output $D_{OUT}$ of the counter 9 induce variations in the counted value equivalent to multiple cycles of the reference signal REF. This variation in the digital output linearizes the conversion of the analog phase difference to the digital output.

The operating range of the digital phase detector 20 can be extended to plus and minus N cycles by a polarity bit added by an optional polarity bit generator 13. The polarity bit generator 13 is implemented using an SR latch or flip-flop to record which corresponding amplitude transition, that of the dithered reference signal DIV' or that of the divided input signal, is first to arrive at the pulse generator 7. The SR latch is set by the divided input signal present at input IN2 of the pulse generator 7 and is reset by the dithered reference signal DIV', present at the latch input of the counter 9.

What is claimed is:

1. A phase detector for producing a digital output according to the phase difference between an input signal and a reference signal, the phase detector comprising:

a first frequency divider receiving the reference signal and dividing the frequency of the reference signal to produce a first divided signal;

a second frequency divider receiving the input signal and dividing the frequency of the input signal to produce a second divided signal;

a dither generator coupled to the first frequency divider, receiving the first divided signal and introducing random timing variation to the first divided signal;

a pulse generator coupled to the dither generator, receiving the first divided signal at a first input and receiving the second divided signal at a second input, generating a pulse having a time duration determined by the time difference between corresponding amplitude transitions of the first divided signal and the second divided signal; and a counter coupled to the pulse generator, receiving the pulse and the reference signal, counting the number of cycles of the reference signal within the time duration of the pulse and producing a digital output representing the counted number of cycles.

2. The phase detector of claim 1 wherein the counter receives the first divided signal and the digital output is latched from the counter at time intervals determined by the first divided signal.

3. The phase detector of claim 1 wherein the dither generator includes a series of logic gates each logic gate in the series having an associated propagation delay, the total propagation delay through the series determined according to a pseudo-random sequence.

4. The phase detector of claim 2 wherein the dither generator includes a series of logic gates each logic gate in the series having an associated propagation delay, the total propagation delay through the series determined according to a pseudo-random sequence.

5. The phase detector of claim 1 further comprising a phase polarity indicator coupled to the first frequency divider and the second frequency divider receiving the first divided signal and the second divided signal and generating an output at a first output state when the phase of the first divided signal leads the phase of the second divided signal and generating the output at a second output state when the phase of the first divided signal lags the phase of the second divided signal.

6. The phase detector of claim 2 wherein the random time variation in the first divided signal varies the time duration of the pulse by at least once cycle period of the reference signal.

7. A phase detector for producing a digital output according to the phase difference between an input signal and a reference signal, the phase detector comprising:

a first frequency divider receiving the reference signal and dividing the frequency of the reference signal to produce a first divided signal;

a second frequency divider receiving the input signal and dividing the frequency of the input signal to produce a second divided signal;

a dither generator coupled to the first frequency divider, receiving the first divided signal and introducing random timing variation to the first divided signal to produce a dithered signal;

a pulse generator coupled to the first frequency divider, receiving the first divided signal at a first input and receiving the second divided signal at a second input, generating a pulse having a time duration determined by the time difference between corresponding amplitude transitions of the first divided signal and the second divided signal; and a counter coupled to the pulse generator and the dither generator, receiving the pulse and the dithered signal, counting the number of cycles of the reference signal within the time duration of the pulse and producing a digital output representing the counted number of cycles.

8. The phase detector of claim 7 wherein the counter is latched at time intervals determined by the dithered signal.

9. The phase detector of claim 8 wherein the dither generator includes a series of logic gates each logic gate in the series having an associated propagation delay, the total propagation delay through the series determined according to a pseudo-random sequence.

10. The phase detector of claim 7 further comprising a phase polarity indicator coupled to the dither generator and the second frequency divider receiving the dithered signal and the second divided signal and generating an output at a first output state when the phase of the dithered signal leads the phase of the second divided signal and generating the output at a second output state when the phase of the dithered signal lags the phase of the second divided signal.

* * * * *